United States Patent [19]
Hauschultz

[11] Patent Number: 5,132,691
[45] Date of Patent: Jul. 21, 1992

[54] METHOD AND APPARATUS FOR RECOGNIZING USEFUL SIGNALS WHEN SUPERIMPOSED WITH NOISE SIGNALS

[75] Inventor: Lars Hauschultz, Kiel, Fed. Rep. of Germany

[73] Assignee: Honeywell-Elac-Nautik GmbH, Fed. Rep. of Germany

[21] Appl. No.: 690,735

[22] Filed: Apr. 24, 1991

[30] Foreign Application Priority Data

Apr. 28, 1990 [DE] Fed. Rep. of Germany ....... 4013684

[51] Int. Cl.⁵ ............................................. G01S 13/04
[52] U.S. Cl. ..................................... 342/159; 342/195
[58] Field of Search ..................... 342/159, 162, 195

[56] References Cited

U.S. PATENT DOCUMENTS

| 3,725,923 | 4/1973 | Bose et al. | 342/107 |
| 3,952,302 | 4/1976 | Mullins | 342/161 |
| 4,093,949 | 6/1978 | Evans | 342/98 |
| 4,845,685 | 7/1989 | Wechsler et al. | 342/195 X |
| 4,907,001 | 3/1990 | Harmuth | 342/159 |
| 4,914,442 | 4/1990 | Kretschmer, Jr. et al. | 342/162 |
| 4,940,988 | 7/1990 | Taylor, Jr. | 342/93 |
| 4,965,584 | 10/1990 | Coulmier et al. | 342/159 |
| 4,965,585 | 10/1990 | Lepere et al. | 342/160 |
| 4,977,405 | 12/1990 | Nothnick | 342/162 |

Primary Examiner—John B. Sotomayor
Attorney, Agent, or Firm—Robert B. Leonard

[57] ABSTRACT

In order to distinguish useful electrical signals from noise signals which are superimposed on the useful signals, a time window is moved along the receiver signal by means of a shift register. If within this time window the received signal exceeds a predetermined minimum level for a predetermined period of time, this receiver signal is recognized as being a useful signal.

13 Claims, 2 Drawing Sheets

METHOD AND APPARATUS FOR RECOGNIZING USEFUL SIGNALS WHEN SUPERIMPOSED WITH NOISE SIGNALS

BACKGROUND OF THE INVENTION

The invention relates to the recognition of pulse-like useful signals which are superimposed by noise signals. A preferred field of application of the invention is the recognition of signals reflected by a target such as the receiver signals in radar and sonar systems. The invention, in particular, relates to the exact recognition of the arrival time of such pulse-like signals if they are superimposed by noise. For the determination of the distance and the spatial position of a target, it is important to exactly determine the point of time when the echo pulse arrives at the receiver. This receiver might be an electroacoustic transducer of a sonar apparatus or might be the antenna of a radar system. Those received pulses are different in shape and duration from the pulses radiated to the target by the radar or sonar transmitter. A correct determination of the beginning of a sonar signal is also required for determining the position of a target by means of two or more hydrophones located spaced apart. This information of the arrival time of the signal normally is derived from the rising leading edge of the received sonar signal. If, however, this signal is superimposed by noise, the detection of the leading edge may result in an uncertain determination of the exact arrival time. In many cases the energy content of noise signals is in the same order as the energy content of the useful signal. In those cases it is not possible to distinguish useful signals from noise signals just by their amplitude.

It is an object of the invention to recognize pulse-like useful signals also in the case when those useful signals are superimposed by noise signals having a higher amplitude as the useful signals. In addition to the distinction between useful signals and noise signals, the invention further relates to the determination of the beginning and the duration of such useful signals which are superimposed by noise signals.

SUMMARY OF THE INVENTION

These and other objects are achieved by the method and apparatus as described in the independent claims. Within a moving time window the amplitude of the received signal is continuously compared with a predetermined limit value, and the signal is recognized as a useful signal if the duration of the signals exceeding the limit value within the time window is larger than a predetermined minimum duration whose length is chosen smaller than the duration of the time window.

With the invention a predetermined minimum duration of the received signal is taken as a criteria for the recognition of the signal as being a useful signal. The recognizing process does not depend on the amplitude of the received signal as long as the received signal exceeds a preset minimum level. Since the length of the useful signal is the criteria for its recognition as a useful signal, this useful signal can be distinguished only from those noise signals whose duration is shorter than a predetermined minimum length of the received useful signal. Preferred embodiments and improvements of this method are described in the dependent claims.

BRIEF DESCRIPTION OF THE DRAWING

The invention now will be described with reference to the drawings in which.

DETAILED DESCRIPTION OF THE PREFERRED EMBODIMENT

Figure 1:
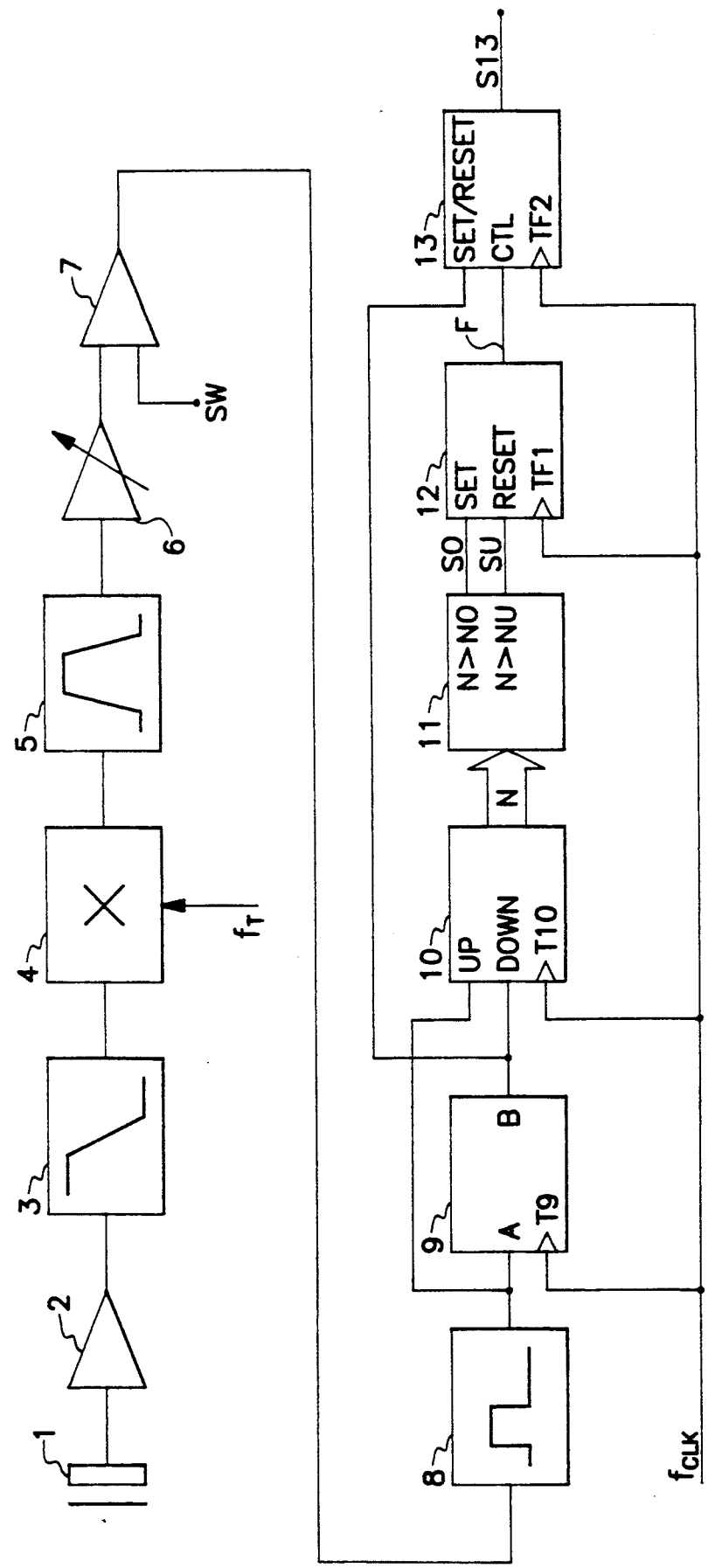
FIG. 1 shows a preferred embodiment of the apparatus according to the present invention.

The circuitry within the individual modules of FIG. 1 is not part of the present invention. Such modules are known in the art so that the entire apparatus can be built from known components and modules. However, the apparatus formed by combining the modules is a portion of the current invention. While the system shown in FIG. 1 may be used with any signal receiver, the following description will use an exemplary sonar system. The apparatus shown in FIG. 1 is used for identifying the signal received by a hydrophone 1 as being a useful signal. If for the purpose of direction finding several hydrophones are used, then each hydrophone will be accompanied by a recognition circuit as shown in FIG. 1. For the determination of the direction from which the incoming soundwaves originate, a processor is used which, dependent on the arrival times of the reflected soundwaves at the various hydrophones, derives the direction of the target by using known formulas and trigonometric relations. Such direction finding systems using several hydrophones are known as such and therefore need not to be described in detail.

In FIG. 1 acoustic waves emitted or reflected by a target are received by an acousto-electrical transducer of hydrophone 1. The output signal of hydrophone 1 is amplified by a preamplifier 2 and is fed to a low-pass filter 3, whose limit frequency $F_p$ corresponds to the maximum frequency of the sonar signal, e.g. $F_p = 100$ kHz. Filter 3 limits the bandwidth of the signal and feeds this limited signal to a multiplier or modulator 4, where the input signal modulates a carrier frequency $f_t$. The carrier frequency might be 455 kHz. By such frequency transformation the use of ceramic filters is possible which have a small bandwidth. The modulation of the received signal onto an intermediate carrier furthermore increases the time resolution of the receiver. A bandpass filter 5 is connected to the output of modulator 4 and limits the output signal of the modulator to a bandwidth of e.g. $df = \pm 1$ kHz. A programmable amplifier 6 changes the signal level such that it fits to the input of the subsequent level detector 7 in which the filtered signal is compared with a predetermined level signal SW. If the output signal of amplifier 6 exceeds such level SW, the level detector 7 delivers at its output a digital signal which is fed to a monoflop 8, where the duration of the input signal is extended to a predetermined minimum length of e.g. 2.2 μs. This minimum pulse length $T_F$ of e.g. 2.2 μs must be larger or identical to the reciprocal value of the lower limit frequency of the bandpass filter which, as mentioned above, might be 454 kHz, i.e. $T_F \geq 1/(455 \text{ kHz df})$.

A shift register 9 having a word length of e.g. 1024 bit comprises a data input A, a clock input T9 and an output B. An up/down counter 10 has a maximum count of 1024 corresponding to the length of shift register 9.

Clock input T9 of shift register 9 and clock input T10 of counter 10 are supplied with a clock signal $f_{CLK}$ of e.g. 512 kHz which is higher than the above-mentioned lower limit frequency of the bandpass filter of 454 kHz. The data input A of shift register 9 is connected to the UP input of counter 10, and the data output B of shift register 9 is connected to the DOWN input of counter 10. The operation of shift register 9 and counter 10 will be explained later with reference to FIG. 2. The content of shift register 9 therewith is shifted in the rhythm of the clock frequency $f_{CLK}$. Because of the shown interconnections, counter 10 at its output permanently indicates the number N of positions within shift register 9 which are occupied by a positive signal "1". A digital comparator 11 permanently compares this count N at the output of counter 10 with a predetermined upper limit count NO of e.g. N=768, which corresponds to 75% of the maximum count of $N_{MAX}=1024$. The comparator 11 further compares the actual count N of counter 10 with a lower limit count NU of e.g. N =256, which corresponds to 25% of the maximum count of N =1024. As soon as count N exceeds the upper limit count NO, a digital signal appears at output SO, which signal indicates that a useful signal has been recognized. If count N of counter 10 falls below the lower limit count NU, a digital signal appears at output SU.

These outputs SO and SU of digital comparator 11 are connected to the SET and RESET inputs of flip-flop 12, which is set when SO =1, which means that a useful signal is recognized, or is reset if SU =1, i.e. when the count N of counter 10 falls below the lower limit count NU. Flip-flop 13, which is a synchronous flip-flop, therefore provides a hysteresis of the recognition signal.

A second synchronous flip-flop 13 has its SET/RESET input connected to output B of shift register 9 and has its control input CTL connected to the output of flip-flop 12 via line F. If flip-flop 12 is set which means that a useful signal is recognized and the beginning of such useful signal appears at the output B of shift register 9 (B =1), flip-flop 13 is set. If flip-flop 12 is reset and the end of the useful signal appears at output B of shift register 9 (B=0), flip-flop 13 is reset. Output S13 of flip-flop 13 therefore delivers a digital signal whose beginning is offset with respect to the rising edge of the received signal by exactly the length of the time window, i.e. by the time which is required for counting from N =0 to N =1024. This output signal at S13 is present for at least a time interval of NO-NU, e.g. 512 clock cycles. If no interruptions are present in the received signal, the length of signal S13 corresponds to the length of the received useful signal.

The output signal of level detector 7 is a sequence of pulses of different length. The prolongation of each pulse to a predetermined minimum length by means of monoflop 8 guarantees that those signals are fed into shift register 9 in the rhythm of the clock frequency $f_{CLK}$.

The time-dependent resolution of the apparatus corresponds to the distance between two succeeding half waves of the output signal of bandpass filter 5 and can be selected by changing the lower limit frequency of said filter. The band width of filter 5 corresponds to the band width of the frequency range which is to be detected within the entire range of useful frequencies. The central frequency of this detection band corresponds to the difference between the carrier frequency and the central frequency of said bandpass filter. By changing the carrier frequency, the detection band can be shifted within the range of useful frequencies. The apparatus according to FIG. 1 for instance has a total receiver frequency range from 0 to 100 kHz, and the central frequency of the detection band having a band width of 2 kHz can be shifted between 1 kHz and 99 kHz. The length of the time window is 2 ms, and the time resolution is 2 μs. At output S13 a digital signal appears if within the time window the amplitude of the received signal exceeds the limit value for a period of time longer than 1.5 ms (=75% of 2 ms).

Figure 2:
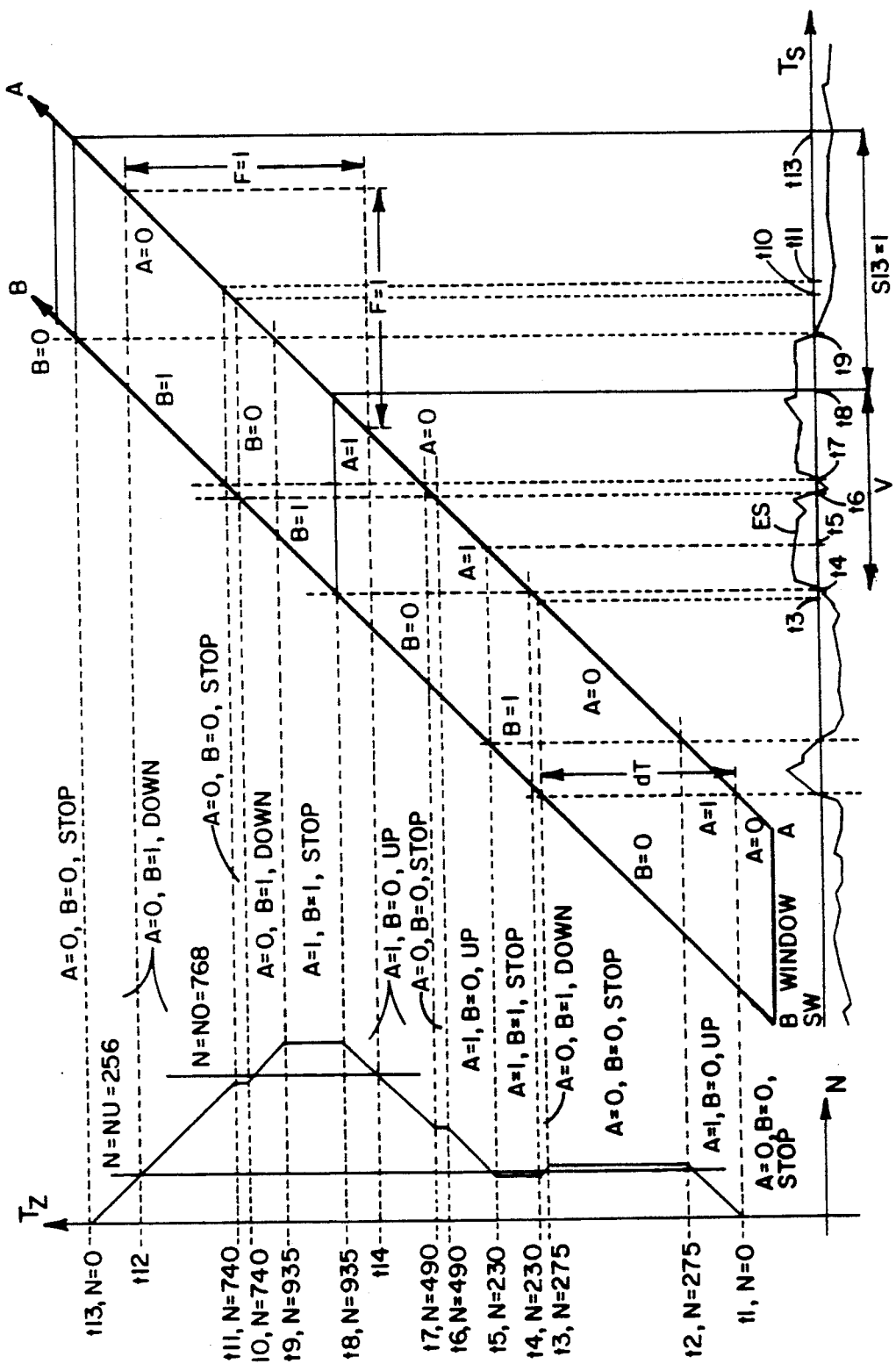
FIG. 2 shows the time-dependent signal curve of a received sonar signal whose step-wise recognition by the apparatus of FIG. 1 is explained by reference to various input/output signals of the modules shown in FIG. 1.

FIG. 2 shows an example for the time relation between the envelope curve of the input signal ES of level detector 7 and the actual count N of counter 10 and output signal S13, respectively. The loading of the digitized received signal into shift register 9 is shown here as a movement of the time window represented by the space between diagonal lines A—A and B—B across the received signal ES. In this figure line A—A shows the time-dependent position of input A, and line B—B shows the position of output B of shift register 9 in relation to the received signal.

In FIG. 2 the filtered digitized input signal ES is shown along horizontal time axis Ts at the bottom of FIG. 2. This input signal ES is by means of level detector 7 compared with the predetermined level SW and partially extends above or below this level. The actual count N of counter 10 is shown along vertical time axis Tz, whereat it is assumed that the maximum count of counter 10 is $N_{MAX}=1024$.

Looking to the curve ES at the bottom of FIG. 2, prior to time t1 the received signal ES is below the limit level SW. Neither at the input A nor at the output B of shift register 9 a signal is available which means A =0 and B =0. Counter 10 doesn't count. As soon as signal ES at time t1 exceeds level SW for the first time, a signal at input A of shift register 9 switches to A =1. This signal is supplied to the UP input of counter 10 so that this counter starts to count upwards. At time t2 signal ES falls below level SW, which means A =0, so that counter 10 stops counting at a count of N =275. The input signal A and the output signal B of shift register 9 now remain A =0 and B =0. In the rhythm of the clock frequency at clock input T9 of shift register 9 the content of this shift register is shifted. The condition of the input signal A therefore appears at output B with a time delay corresponding to the length dt of shift register 9. This delay period dt corresponds to the vertical distance between the two diagonal lines A—A and B—B in FIG. 2. As soon as in relation to the vertical time axis Tz the first signal pulse which had appeared at time t1 at the input of shift register A now appears at the time t2 at output B, now the output signal B switches to B =1 and counter 10 now starts at time t3 to count downwards beginning at count N =275. At the time t4 signal ES again exceeds level SW so that now the input signal A of shift register switches to A =1. The output signal of shift register 9 is still B =1. Caused by the switching of the input signal which simultaneously is fed to the UP input of counter 10, this counter now is stopped at time t4. As soon as the entire receiving signal ES as far as moved into shift register 9 in the time interval between t1 and t2 is moved through said shift register, the output of the register at t5 switches to B =0. Input A remains at A =1 because signal ES at the time t5 is still above level SW. At the time t5 counter again starts to count upwards. This counting is interrupted at t6 when signal ES falls below level SW. At t6 signal A switches to A = 0. Counter 10 stops counting at a count of N = 490.

When signal ES at time t7 again exceeds level SW, counter 10 starts counting upwards from count N = 490. The signal loaded into shift register 9 during the period t1 to t6 is shifted through the register and at the time t8 has left the register. At this time t8 output B of register 9 switches to B = 1 and counter 10 stops counting. The input of shift register 9 stays at A = 1 because at time t8 signal ES still is above level SW. At the time t9 signal ES falls below level SW, and the input signal of register 9 becomes A = 0. Since at the output of shift register 9 the signal still is B = 1, counter 10 again starts counting downwards beginning at count N = 935.

As soon as signal S loaded into shift register 9 is shifted out of the register at time t10, the output signal B changes to B = 0, and counter 10 stops counting at a count N = 740. If now the signal interruption in the period of time between t6 and t7 was moved through shift register 9, an output signal B = 1 appears caused by the signal portion between t7 and t8 leaving the shift register. Therefore at time t11 counter 10 again starts counting downwards because at this time there is no input signal for the shift register, i.e. A = 0. In the course of this downward counting, counter 10 at the time t12 counts through the lower limit count NU = 256 and at the time t13 reaches count N = 0. At this time t13 counter 10 again terminates counting and remains at N = 0 until a new signal ES appears and the procedure starts again from time t1 as described above.

The operation of counter 10 dependent on input signal A and output signal B of shift register 9 can be summarized as follows:

Counting upwards if A = 1 and B = 0 as long until N = 1024, whereat the counter stops if A = 0 and B = 1.
Counting downwards if A = 0 and B = 1 until N = 0, whereat the counter stops if A = 0 and B = 0.

After having described the operation of counter 10 controlled by the signals at the input and output of shift register 9, the processing of the counter output N will now be described. A digital comparator 11 continuously compares count N of counter 10 with a predetermined upper limit count NO and with a predetermined lower limit count NU. As an example NO is set to NO = 768 and NU is set to NU = 256. When counting upwards a digital signal SO appears on line SO if count N exceeds the upper limit count NO. During downwards counting a digital signal SU appears on line SU if N falls below NU. These signals are fed to the SET and RESET inputs of flip-flop 12. FIG. 2 shows that at time t14 during upward counting count N exceeds upper limit count NO and that at time t12 during downwards counting count N falls below lower limit count NU. In the time interval between t14 and t12 flip-flop 12 is set and delivers at its output F a signal F = 1. Second flip-flop 13 is controlled at its control input CTL by the output signal F of flip-flop 12 and at its SET/RESET input by the output signal B of shift register 9. If flip-flop 12 is set which means F = 1, flip-flop 13 will also be set as soon as at time t8 the output signal of shift register 9 becomes B = 1. When the output signal of flip-flop 12 disappears, i.e. F = 0, flip-flop 13 will be reset as soon as at time t13 the output signal of shift register 9 switches to B = 0. The output signal S13 of flip-flop 13 therefore extends between time t8 and time t13 and is delayed with respect to the first appearance of signal ES at t4 by the time interval between t4 and t8. This time interval corresponds to the vertical extension dT of the time window, i.e. the delay V = dT.

Since shift register 9 and flip-flop 13 together generate a predetermined delay V of signal ES, time t4 of the first instant where signal ES exceeds level SW can be determined by subtracting this delay V from time t3 where the output signal S13 begins. The example shows that any noise which does not exceed the minimum length of the sonar signal ES has no influence on the behavior of output signal S13 even if such disturbance appears in the time interval t1 to t2 shortly prior to the useful signal or in the time interval t6 to t7 interrupts the useful signal. The apparatus removes such noise signals effectively. The criteria whether or not a received signal ES is recognized as a useful signal and is indicated as an output signal S13 consists in that the total length of the signal exceeding the limit level SW within the time window V exceeds a minimum length $L_{MIN}$ which is calculated by multiplying the upper limit count NO with the duration of one period of the clock signal $f_{CLK}$. As an example: $768 \times 0.2 \mu s = 1.536$ ms. In the shown embodiment the useful signal starts at t4, and the time window extends until t8. Already at t14, however, the upper limit count NO = 768 is exceeded. The duration of the time window is calculated from the bit-length 1,024 of the shift register and the clock frequency, e.g. 1,024 bit $\times 0.2 \mu s = 2.048$ ms.

I claim:

1. A method for distinguishing useful electrical signals from noise signals in the output signal of an electroacoustical receiver transducer or a radar receiver, that method comprising the steps of:
   a) comparing the receiver signal ES with a predetermined minimum level SW;
   b) feeding those receiver signals exceeding said minimum level to a pulse-shaping circuit which provides output pulses of predetermined amplitude and a predetermined minimum length;
   c) applying said output pulses of said pulse-shaping circuit to the data input A of a shift register, whose clock input is connected to a common source of clock signals;
   d) shifting the input signal of said shift register through said register, said shifting being controlled by said clock signals;
   e) feeding an output signal B of said shift register to a DOWN input of an UP/DOWN counter, whose UP input is connected to the input of said shift register and whose clock input is connected to said common source of clock signals, said counter having a maximum count $N_{MAX}$ corresponding to the number of stages of said shift register;
   f) permanently applying a signal corresponding to an instant count N of said counter to the data input of a digital comparator which has a preset upper count level NO and has a preset lower count level NU;
   g) said digital comparator delivering a first digital output signal SO if the instant count of said counter during upwards counting exceeds the upper count level NO, and said digital comparator delivering a second digital output signal SU if the instant count of said counter during downwards counting falls below the lower count level NU;
   h) feeding the first and second output signals SO, SU of said digital comparator to a SET and to a RESET input, respectively, of a first bistable circuit, whose clock input is connected to said common source of clock signals;

i) applying an output signal F of said first bistable circuit to a control input of a second bistable circuit whose clock input is connected to said common source of clock signals;

j) feeding the output signal B of said shift register to a SET/RESET input of said second bistable circuit which delivers an output signal S13 indicating the presence of a useful receiver signal if and as long as an output signal F of said first bistable circuit is present at the control input of said second bistable circuit and the shift register delivers an output signal B to the SET/RESET input of said second bistable circuit; and k) resetting said second bistable circuit as soon as both the output signal F of said first bistable circuit and the output signal B of said shift register disappear.

2. The method of claim 1 comprising the additional step of modulating the receiver signal onto a higher frequency carrier signal and limiting the bandwidth of said modulated carrier signal before comparing the signal with said predetermined minimum level SW.

3. The method of claim 1 including the additional step of determining the actual start time of the useful signal by subtracting the duration of a delay period V from the actual time at the beginning of the output signal S13 of the second bistable circuit with said delay period or time window corresponding to the product of the number of stages of said shift register and the period length of the clock signal ($V = n_{SR}/f_{CLK}$).

4. The method of claim 1 including the additional step of selecting the upper count level NO such that the minimum length $L_{MIN}$ of a receiver signal as being recognized as a useful signal is multiplied with the frequency $f_{CLK}$ of the clock signal ($NO = L_{MIN} \times f_{CLK}$).

5. The method of claim 4 comprising the additional step of selecting the lower count level NU such that it corresponds to the difference between the maximum count $N_{MAX}$ of said counter and the upper count level NO ($NU = N_{MAX} - NO$).

6. An apparatus for distinguishing useful electrical signals from noise signals, comprising:

a) receiver for receiving and transducing the signals into electrical receiver signals;

b) a comparator connected to said receiver for comparing said electrical receiver signals to a minimum level control signal and delivering an output signal if the receiver signal exceeds said minimum level signal;

c) a shift register having a number of stages $n_{SR}$ connected to said comparator and having data and clock input terminals and an output terminal, said shift register receiving the output signal of said comparator;

d) an UP/DOWN counter connected to said shift register and having UP, DOWN and clock input terminals and an output terminal said counter having a maximum count, $N_{MAX}$ corresponding to the $n_{SR}$, said counter having its DOWN input terminal connected to the output terminal of said shift register, and its UP input terminal connected to the data input terminal of said shift register, said counter operable to produce an actual count signal representative of the actual count of said counter;

e) a digital comparator means having an input terminal connected to said output terminal of said counter and first and second output terminals, said digital comparator producing a first output signal at said first output terminal if during upwards counting the actual count exceeds a preset upper count level and delivering a second output signal at a second output terminal if during downward counting the actual count falls below a preset lower count level;

f) a first flip-flop having a SET input terminal connected to the first output terminal and having a RESET input terminal connected to the second output terminal of said digital comparator and having a clock input terminal and an output terminal;

g) a second flip-flop having a control input terminal connected to said output of the first flip-flop, said second flip-flop having a SET/RESET input terminal connected to the output terminal of said shift register and having a clock input terminal; said second flip-flop being operable to produce a digital signal representative of the presence of a useful electrical signal if and as long as said second flip-flop is set by said output signal of said shift register and said first flip-flop delivers digital output signals to said control input terminal of said second flip-flop; and h) a clock signal generator connected to said clock input terminals of said shift register, UP/DOWN counter, and said first and second flip-flops.

7. The apparatus of claim 6 further comprising:
a one-shot circuit connected between said output terminal of said comparator and said data input terminal of said shift register, said one-shot circuit delivering digital signals of a predetermined minimum length.

8. The apparatus of claim 6 further comprising:
modulator means connected between said receiver and said comparator, said modulator means receiving the output signal of said receiver and a high frequency carrier signal for modulating said carrier signal with said receiver signal, and comprising a bandpass filter for limiting the bandwidth of the modulated signal before feeding it to said comparator.

9. The apparatus of claim 8 further comprising:
a controlled amplifier connected between said modulator means and said comparator.

10. The apparatus of claim 8 further comprising:
a pre-amplifier and a low pass filter connected between said receiver and said modulator means.

11. The method for distinguishing useful electrical signals from noise signals, comprising the steps of:
comparing a receiver signal with a predetermined minimum level;
forming a first output signal train from said receiver signals which exceed said minimum level;
passing said first output signal train through a shift register, said shift register further receiving a common clock signal;
passing an output signal of said shift register to a DOWN input of an UP/DOWN counter;
passing said first output signal train to an UP input of said UP/DOWN counter, said counter also receiving said common clock signal;
comparing an instant count of said counter and predetermined upper and lower count levels using a digital comparator, the digital comparator producing a first digital output if the instant count of said counter during upwards counting exceeds the upper count level and said digital comparator delivering a second digital output signal if the instant count of said counter during downwards counting falls below the lower count level;

producing a first bistable output signal from a first bistable circuit, said first bistable circuit having as inputs said first and second digital outputs, said first bistable circuit receiving said common clock signal;

producing a second bistable output signal from a second bistable circuit connected to said common source of clock signals, said second bistable circuit having said first bistable signal and said shift register output as inputs and producing a system output signal indicating the presence of a useful receiver signal if and as long as said first bistable signal is present at a control input of said second bistable circuit and said shift register delivers an output signal to a SET/RESET input of said second bistable circuit, said second bistable circuit resetting as soon as both said first bistable output signal and said shift register output signal are equal to 0.

12. The method of claim 11, wherein said signal shaping step further includes the steps of:

forming said output signal train as a series of pulses having a predetermined amplitude and a predetermined minimum length.

13. The method of claim 12, comprising the further steps of:

modulating the receiver signal onto a higher frequency carrier signal; and limiting the bandwidth of said modulated carrier signal before comparing the signal with said predetermined minimum level.

* * * * *